(12) United States Patent
Shuler, Jr.

(10) Patent No.: US 7,859,292 B1
(45) Date of Patent: Dec. 28, 2010

(54) METHODS AND CIRCUITRY FOR RECONFIGURABLE SEU/SET TOLERANCE

(75) Inventor: Robert L. Shuler, Jr., Friendswood, TX (US)

(73) Assignee: United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 12/502,575

(22) Filed: Jul. 14, 2009

(51) Int. Cl.
*H03K 19/003* (2006.01)
*H03K 19/007* (2006.01)

(52) U.S. Cl. .............................. 326/11; 326/40; 326/46; 714/797

(58) Field of Classification Search .................... 326/11, 326/38–40, 46; 714/725, 797
See application file for complete search history.

(56) References Cited

U.S. PATENT DOCUMENTS

| | | | |
|---|---|---|---|
| 5,931,959 A | 8/1999 | Kwiat | |
| 6,963,217 B2 | 11/2005 | Samudrala et al. | |
| 7,036,059 B1 * | 4/2006 | Carmichael et al. | 714/725 |
| 7,124,347 B2 | 10/2006 | Plants | |
| 7,200,822 B1 | 4/2007 | McElvain | |
| 7,250,786 B1 | 7/2007 | Trimberger | |
| 7,266,020 B1 | 9/2007 | Trimberger | |
| 7,310,759 B1 | 12/2007 | Carmichael et al. | |
| 7,383,479 B1 * | 6/2008 | Carmichael et al. | 714/725 |
| 7,512,871 B1 | 3/2009 | Carmichael et al. | |
| 7,620,883 B1 * | 11/2009 | Carmichael et al. | 714/797 |
| 2007/0220367 A1 | 9/2007 | Smith et al. | |

* cited by examiner

*Primary Examiner*—Daniel D Chang
(74) *Attorney, Agent, or Firm*—Theodore U. Ro

(57) ABSTRACT

A device is disclosed in one embodiment that has multiple identical sets of programmable functional elements, programmable routing resources, and majority voters that correct errors. The voters accept a mode input for a redundancy mode and a split mode. In the redundancy mode, the programmable functional elements are identical and are programmed identically so the voters produce an output corresponding to the majority of inputs that agree. In a split mode, each voter selects a particular programmable functional element output as the output of the voter. Therefore, in the split mode, the programmable functional elements can perform different functions, operate independently, and/or be connected together to process different parts of the same problem.

28 Claims, 7 Drawing Sheets

VOTE/SPLIT

| MODE | A | B | C | OUTPUT |
|------|---|---|---|--------|
| 0 | a | b | c | a |
| 1 | a | b | c | majority (a,b,c) |

FIG. 4C

METHODS AND CIRCUITRY FOR RECONFIGURABLE SEU/SET TOLERANCE

The invention described herein was made by employee(s) of the United States Government and may be manufactured and used by or for the Government of the United States of America for governmental purposes without the payment of any royalties thereon or therefore.

BACKGROUND OF THE INVENTION

1. Field of the Invention

The present invention relates generally to circuitry which may be operated in environments whereby the circuitry is subject to single event upsets (SEU) and/or single event transients (SET) and, more specifically, to circuitry which is reconfigurable for adjusting the SEU/SET tolerance thereof.

2. Description of Related Art

The Field Programmable Gate Array (FPGA) is a type of programmable logic device (PLD). The FPGA may comprise an array of programmable tiles or programmable functional elements such as, for example, input/output blocks (IOBs), configurable logic blocks (CLBs), look up tables (LUTs), dedicated random access memory blocks (BRAM), multipliers, digital signal processing blocks (DSPs), processors, clock managers, delay lock loops (DLLs), multi-gigabit transceivers (MGTs), and/or the like.

Another type of PLD is the complex programmable logic device, or CPLD. A CPLD may include two or more programmable functional elements connected together and also connected to input/output (I/O) resources by an interconnect switch matrix. Each programmable function block of the CPLD may include a two-level AND/OR structure similar to those used in programmable logic arrays (PLAs) and programmable array logic (PAL) devices. In some CPLDs, configuration data may be stored on-chip in non-volatile memory. In other CPLDs, configuration data may be stored off-chip in non-volatile memory, and then downloaded to volatile memory as part of an initial configuration sequence.

The above paragraphs describe a non-limiting list of various types of PLDs. PLDs may be utilized to form the electronic circuits for many different types of applications. A non-limiting list of applications may comprise telecommunications, networking, consumer, automotive, industrial applications, signal processing, LiDAR, image processing for crew display, pattern recognition, and the like. Future devices which utilize the present invention may be based on other technologies such as nanotechnologies There is a growing use of PLDs in applications subject to radiation and/or other interference which may cause a single event upset (SEU) and single event transient (SET). For example, FPGAs are being utilized more often in space and military applications. Accordingly, there is an increasing need for efficient SEU/SET mitigation techniques.

SEU/SET mitigation methods for PLD circuits fall into two broad groups: manufacturer designed built-in circuit techniques and end-user designed firmware techniques. Built-in circuit techniques can be utilized to more quickly and more reliably provide SEU/SET mitigation. End-user designed techniques can be used to provide tailor made solutions which are more efficient with higher data capacity but may be less reliable due to greater difficulty in providing reliable SEU/SET mitigation.

Thus, presently available devices are normally committed to a fixed SEU/SET mitigation configuration, i.e., the entire device is either redundant or is not redundant. Built-in redundancy in the hardware provides high performance and greater assurance of reliable operation. However, many applications only need to be partly protected from SEU/SET and would preferably also permit high capacity if possible. Capacity, the amount of data flow per unit of time and/or the total algorithmic complexity, is reduced in proportion to the amount of redundancy utilized. Redundancy is usually provided as 2× or 3×, where 2× redundancy may require two data flow lines and 3× redundancy may require three data flow lines. For example, SEU mitigation of logic circuits may be accomplished by implementing triple modular redundancy (TMR) and other techniques. However, economical alternatives to TMR have long been sought.

Large-capacity, high-performance reprogrammable FPGAs marketed for use in space, and having latch up and total dose hardness, but without built in SEU/SET tolerance, have required designers to program SEU/SET mitigation into the FPGA as part of the application. Having the SEU/SET mitigation under user control allows partitioning of a design into protected and unprotected sections. However, there are many papers on the pitfalls of taking an FPGA and programming SEU/SET by adding redundancy through the firmware programming. Some problems can be very subtle. For example, there may be some underlying common source of error that is unknown due to the underlying structure of the chip. Moreover, the circuitry is expensive to test due to the requirement for testing within an environment with sufficient radiation to cause errors.

As an alternative to hardware techniques, redundancy may be provided via the software programming of the device, rather than in pre-wired hardware. However, software programming techniques may be less efficient, may take more time, and may intrude upon the application design. Typically, hardware redundancy has the advantage of being transparent to the application.

For SRAM-based FPGAs having their configuration stored in SEU susceptible SRAM, SEU mitigation requires protecting the configuration memory from the accumulation and indefinite retention of errors, usually by scrubbing. One purpose of scrubbing is that it protects the TMR mechanism, which would eventually fail due to multiple errors accumulating over time and affecting multiple voting domains. Without TMR, scrubbing reduces the time period (potentially indefinite) during which the device is functioning erroneously.

SEU/SET tolerances may be quantified in terms of error rates. Error rates from SEU/SET are often expressed as errors per bit-day. What constitutes a "lower" or "higher" SEU/SET tolerance is highly dependent on a subject environment. Stated otherwise, the error rate for a particular device will be a function of the environment in which it is operated, including the total amount of radiation, and the composition (e.g. protons, heavy ions, etc.) and energy of that radiation. Each type of radiation particle, at a specific energy, deposits a characteristic amount of energy per unit length of travel through silicon. This is called Linear Energy Transfer (LET), measured in units such as MeV·cm$^2$/mg (energy lost by the particle to the material per unit path length MeV/cm divided by the density of the material mg/cm$^3$). In ground tests using particle accelerators, circuits are characterized by the upset rate for a given particle flux at a given LET. Using models of radiation in various environments, such as Low Earth Orbit or Deep Space, error rates can be estimated from the test data. Occasionally data is directly obtained by placing test specimens in Low Earth Orbit, but rarely in other instances due to impracticality. What constitutes an "acceptable" error rate is heavily dependent on, for example, the application; the duration of use of the application; the size of the application; the criticality of the application; and the radiation environment. Errors per bit-day multiplied by the total number of bits in an application (including configuration bits if it is a PLD) give an estimate of aggregate error rate for the application. The inverse of error rate is Mean Time Between Failure (MTBF). As an example, if an application is designated as "safety or mission critical," and should not experience an error, then MTBF should be much larger than the period of use of the application. Critical applications might be used only for seconds, as when a thruster is firing, or for the entire life of a multi-year deep-space mission, such as a human mission to Mars. If a 99.9999% probability of success is desired, then the MTBF would need to be 1000000 times the period of use. But for a non critical application, the MTBF might be far less than the period of use, according to the number of errors that were considered tolerable (i.e., a SEU/SET tolerance). When considering generally the difference between protected (also called mitigated) and unprotected (non-critical) applications, many orders of magnitude difference in error rates are implied, with the protected application having an MTBF similar to or much greater than the period of use, and the unprotected application (or one protected by other means) having an MTBF lower than the period of use.

The following patents describe some of the efforts made in the field of SEU/SET error mitigation:

U.S. Pat. Nos. 7,250,786 and 7,250,786, to S. Trimberger, issued Jul. 31, 2007 and Sep. 4, 2007, respectively, disclose a method and apparatus to provide triple modular redundancy (TMR) in one mode of operation, while providing multiple context selection during a second mode of operation. Intelligent voting circuitry facilitates both modes of operation, while further enhancing the robustness of the design when used in a TMR mode of operation. Various addressing schemes are provided, which allow dual use of the configuration data lines as selection signals using one addressing scheme, while allowing for dual use of the configuration address lines as selection signals using the second addressing scheme.

U.S. Pat. Nos. 7,310,759 and 7,512,871, to Carmichael et al., issued Dec. 18, 2007 and Mar. 31, 2009, respectively, disclose SEU mitigation, detection, and correction techniques. Mitigation techniques include: triple redundancy of a logic path extended the length of the FPGA; triple logic module and feedback redundancy provides redundant voter circuits at redundant logic outputs and voter circuits in feedback loops; enhanced triple device redundancy using three FPGAs is introduced to provide nine instances of the user's logic; critical redundant outputs are wire-ANDed together; redundant dual port RAMs, with one port dedicated to refreshing data; and redundant clock delay locked loops (DLL) are monitored and reset if each DLL does not remain in phase with the majority of the DLLs. Detection techniques include: configuration memory readback wherein a checksum is verified; separate FPGAs perform readbacks of configuration memory of a neighbor FPGA; and an FPGA performs a self-readback of its configuration memory array. Correction techniques include reconfiguration of partial configuration data and "scrubbing" based on anticipated SEUs.

U.S. Pat. No. 5,931,959, to K. Kwiat, issued Aug. 3, 1999, discloses computing modules which can cooperate to tolerate faults among their members. In a preferred embodiment, computing modules couple with dual-ported memories and interface with a dynamically reconfigurable Field-Programmable Gate Array ("FPGA"). The FPGA serves as a computational engine to provide direct hardware support for flexible fault tolerance between unconstrained combinations of the computing modules. In addition to supporting traditional fault tolerance functions that require bit-for-bit exactness, the FPGA engine is programmed to tolerate faults that cannot be detected through direct comparison of module outputs. Combating these faults requires more complex algorithmic or heuristic approaches that check whether outputs meet user-defined reasonableness criteria. For example, forming a majority from outputs that are not identical but may nonetheless be correct requires taking an inexact vote. The FPGA engine's flexibility extends to allowing for multiprocessing among the modules where the FPGA engine supports message passing. Implementing these functions in hardware instead of software makes them execute faster. The FPGA is reprogrammable, and only the functions required immediately need be implemented. Inactive functions are stored externally in a Read-Only Memory (ROM). The dynamically reconfigurable FPGA gives the fault-tolerant system an output stage that offers low gate complexity by storing the unused "gates" as configuration code in ROM. Lower gate complexity translates to a highly reliable output stage, prerequisite to a fault tolerant system.

U.S. Pat. No. 7,124,347, to W. Plants, issued Oct. 17, 2006, discloses a method for detecting an error in data stored in configuration SRAM and user assignable SRAM in a FPGA comprises providing serial data stream into the FPGA from an external source, loading data from the serial data stream into the configuration SRAM in response to address signals generated by row column counters, loading data from the serial data stream into the user assignable SRAM in response to address signals generated by row and column: counters, loading a seed and signature from the serial data stream into a cyclic redundancy checking circuit, cycling data out of configuration SRAM and user assignable SRAM by the row and column counters, performing error checking on the data that has been cycled out of the configuration SRAM and out of the user assignable SRAM by the cyclic redundancy checking circuit, and generating an error signal when an error is detected by the error checking circuit.

U.S. Pat. No. 6,963,217, to Samudrala et al., issued Nov. 8, 2005, discloses a method for reducing circuit sensitivity to single event upsets in programmable logic devices. The method involves identifying single event upset sensitive gates within a single event upset sensitive sub-circuit of a programmable logic device as determined by the input environment and introducing triple modular redundancy and voter circuits for each single event upset sensitive sub-circuit so identified.

U.S. Pat. No. 7,200,822, to K. McElvain, issued Apr. 3, 2007, discloses digital circuits with time multiplexed redundancy and methods and apparatuses for their automated designs generated from single-channel circuit designs. A digital circuit detects or corrects transitory upsets through time-multiplexed resource sharing. Time-multiplexed resource sharing is used to reduce the die area for implementing modular redundancy. This patent also discloses automatically synthesizing multi-channel hardware for time-multiplexed resource sharing by automatically generating a time-multiplexed design of multi-channel circuits from the design of a single-channel circuit, in which at least a portion of the channels are allocated for modular redundancy.

The above approaches do not solve the aforementioned problems. The complexity and difficulty of end-user-designed mitigation is encountered over and over through the life cycle of the application. Ideally the application could assume the hardware was performing correctly by means of redundancy built in to the hardware. However because some applications, such as signal processing, may better handle errors through their existing protocol techniques, it would be desirable to be able to select capacity over redundancy.

Those of skill in the art will appreciate the present invention that addresses the above and other problems.

SUMMARY OF THE INVENTION

An object of the present invention is to provide improved SEU/SET resistant circuitry.

Another possible object of the present invention is to provide a reconfigurable level of redundancy in the hardware.

Another possible object of the present invention is to enable a TMR, FPGA, or similar device to be reconfigured in whole or part to provide higher capacity in a non-redundant operating mode.

Another possible object of the present invention is to enable users with the ability to choose increased data flow capacity over redundancy in an integrated circuit.

Another possible advantage of the present invention is that built-in hardware redundancy attendant speed and ease of design can be utilized without giving up high capacity for other parts of an application.

However, it will be understood that the above-listed objectives and/or advantages of the invention are intended only as an aid in quickly understanding aspects of the invention, are not intended to limit the invention in any way, and therefore do not form a comprehensive or restrictive list of objectives, and/or features, and/or advantages.

Accordingly, one embodiment of the invention provides a reconfigurable programmable integrated circuit which may comprise a plurality of programmable functional elements, programmable interconnections for the programmable functional elements, and a mode control operably connected with the programmable functional elements. In a redundant mode of operation, the programmable functional elements produce an output which is voted. In a split channel mode of operation, the programmable functional elements produce an output which is not voted.

The programmable functional elements may be organized into a plurality of blocks, which may each be physically positioned on an integrated circuit. In this embodiment, each block is preferably sufficiently physically separated from others of the plurality of blocks to prevent a single SEU/SET causing an error in two blocks at the same time.

The reconfigurable programmable integrated circuit may also comprise a plurality of voters electrically connected to the programmable functional elements. In one embodiment, the plurality of voters is connected to provide a triple redundant mode of operation.

The reconfigurable programmable integrated circuit may further comprise pre-wired electrical continuous connections without switches between the plurality of voters in the plurality of different blocks.

The reconfigurable programmable integrated circuit may further comprise switchable connections between the blocks where each of the switchable connections between the plurality of blocks may comprise at least two switches. In one embodiment, the two switches are sufficiently physically separated from each other to prevent a single SEU/SET causing an error in both switches at the same time.

The reconfigurable programmable integrated circuit may also comprise a plurality of programmable functional elements operable to be programmed to form at least one electronic circuit and a programmable routing network operably connected to the programmable functional elements, wherein said plurality of programmable functional elements and said programmable routing network are organized into a plurality of blocks, wherein each of said plurality of blocks are sufficiently physically separated from others of said plurality of blocks to prevent a single SEU/SET causing an error in any two of said plurality of blocks at the same time.

In another embodiment, a method for making a reconfigurable programmable integrated circuit may comprise steps such as providing a plurality of programmable functional elements on a reconfigurable programmable integrated circuit, providing a at least one programmable interconnection between the programmable functional elements, and providing a mode control with a redundant mode of operation and a split channel mode of operation. As a practical matter in most cases, but perhaps not all, there will be many possible programmable interconnections available for the designer of an application. In the redundant mode of operation, the programmable functional elements produce outputs which are majority voted. In the split channel mode of operation, the programmable functional elements produce outputs which are not majority voted.

In another embodiment of the invention, reconfigurable programmable circuitry is provided that may comprise a plurality of programmable functional elements and a mode control for adjusting a SEU/SET tolerance or plurality of SEU/SET tolerances whereby in a first mode of operation the electronic circuits formed by the programmable functional elements have a first SEU/SET tolerance comprised of a relatively lower SEU/SET tolerance and in a second mode of operation they have a second SEU/SET tolerance comprised of a relatively higher SEU/SET tolerance wherein the relative nature of the SEU/SET tolerance is based on comparison between the first and second SEU/SET tolerances or between each of the plurality of tolerances.

In one embodiment, in the first mode of operation, the programmable functional elements can be programmed differently and can perform different functions. In the second mode of operation, the programmable functional elements are programmed identically to operate in a triple redundant mode of operation.

The plurality of programmable functional elements may be organized into a plurality of blocks which may be on the same integrated circuit or on different integrated circuits or part of other circuitry. In any case, each block is sufficiently physically separated from others of the plurality of blocks, or is sufficiently otherwise radiation hardened, to prevent a single SEU/SET causing an error in two blocks at the same time.

In one embodiment, the reconfigurable programmable circuitry may comprise a plurality of voters electrically connected to the plurality of programmable functional elements. In the second mode of operation, the plurality of voters is connected to provide the triple redundant mode of operation.

In another embodiment, a method is provided for making programmable circuitry, which may comprise steps such as forming a plurality of programmable functional elements, and providing a mode control for the programmable functional elements for adjusting an SEU/SET tolerance thereof. In a first mode of operation, the electronic circuits of the programmable functional elements have a relatively lower SEU/SET tolerance. In a second mode of operation, they have a relatively higher SEU/SET tolerance.

The method may comprise organizing the plurality of programmable functional elements into a plurality of blocks, and providing that each block is sufficiently physically separated from others of the plurality of blocks to prevent a single SEU/SET causing an error in two blocks at the same time. A plurality of voters may be electrically connected to the programmable functional elements to provide a triple redundant mode of operation as the second mode of operation.

In another embodiment, a reconfigurable programmable integrated circuit may comprise a plurality of programmable functional elements which process data, a plurality of mode controlled voters, and a mode control, wherein the voter output is responsive to the mode control with a first mode of operation and a second mode of operation. In the first mode of operation each voter output is responsive to only one of the respective outputs of the programmable functional elements. In the second mode of operation, the voter output is responsive to a majority of the respective outputs of the programmable functional elements.

The mode controlled voters may be connected together in groups of three, whereby in the second mode of operation the three mode controlled voters produce three voter outputs.

In yet another embodiment a method for making a reconfigurable programmable integrated circuit may comprise providing a plurality of programmable functional elements, and connecting the respective outputs of the plurality of programmable functional elements to a plurality of mode controlled voters. In a first mode of operation, operation each voter output is responsive to only one of the respective outputs. In a second mode of operation, the voter output is responsive to a majority of the respective outputs of the plurality of programmable functional elements.

In another embodiment, a reconfigurable programmable integrated circuit may comprise a plurality of programmable functional elements and a plurality of programmable interconnections for the plurality of programmable functional elements. The plurality of programmable interconnections may be organized into a plurality of blocks. Each block may be sufficiently physically separated from others of the plurality of blocks to prevent a single SEU/SET causing an error in two blocks at the same time.

The reconfigurable programmable integrated circuit may further comprise switchable connections between the plurality of blocks wherein each of the switchable connections comprise at least two switches. The two switches are sufficiently physically separated from each other to prevent a single SEU/SET causing an error in both switches at the same time.

At least two configuration bits may be utilized for controlling the two switches. The circuitry for the two configuration bits is sufficiently physically separated to prevent a single SEU/SET causing an error in the at least two switches at the same time.

In another embodiment, a method for making a reconfigurable programmable integrated circuit may comprise providing a plurality of programmable functional elements, providing a plurality of programmable interconnections for the programmable functional elements, and organizing the programmable functional elements and the programmable interconnections into a plurality of blocks such that each block is sufficiently physically separated from other blocks to prevent a single SEU/SET causing an error in two blocks at the same time.

Other steps may comprise providing that all switchable connections between the blocks comprise at least two switches wherein each of the two switches connect to an associated intermediate line, which connects between two blocks. The method may further comprise physically separating the two switches sufficiently from each other to prevent a single SEU/SET causing an error in both switches at the same time.

BRIEF DESCRIPTION OF THE DRAWINGS

FIG. 4C is a truth table of inputs and outputs of the voter of FIG. 4A in accord with one possible embodiment of the present invention;

DETAILED DESCRIPTION OF PREFERRED EMBODIMENTS

One embodiment of the present invention enables reconfiguration of SEU/SET tolerance in selective physical locations within programmable logic devices (PLDs). For example, circuitry internal to an integrated circuit may be selectively reconfigured for either redundant or non-redundant operation. In this way, the application can be tailor made for the right mix of reliability and high capacity. The present invention can be utilized to provide more quickly designed, reliable firmware redundancy where needed, while permitting other areas of integrated circuits to operate in a single channel mode of operation having high data capacity.

Even incorporating the dual mode of operation capability, the device may retain up to 95% of the capacity, or possibly more, as compared with a device that does not utilize pre-wired redundant operation. In accord with the present invention, developers can design hardware redundancy into applications without encountering the many pitfalls of attempting to design redundancy into circuitry which may otherwise be used for single channel operation.

Figure 1:
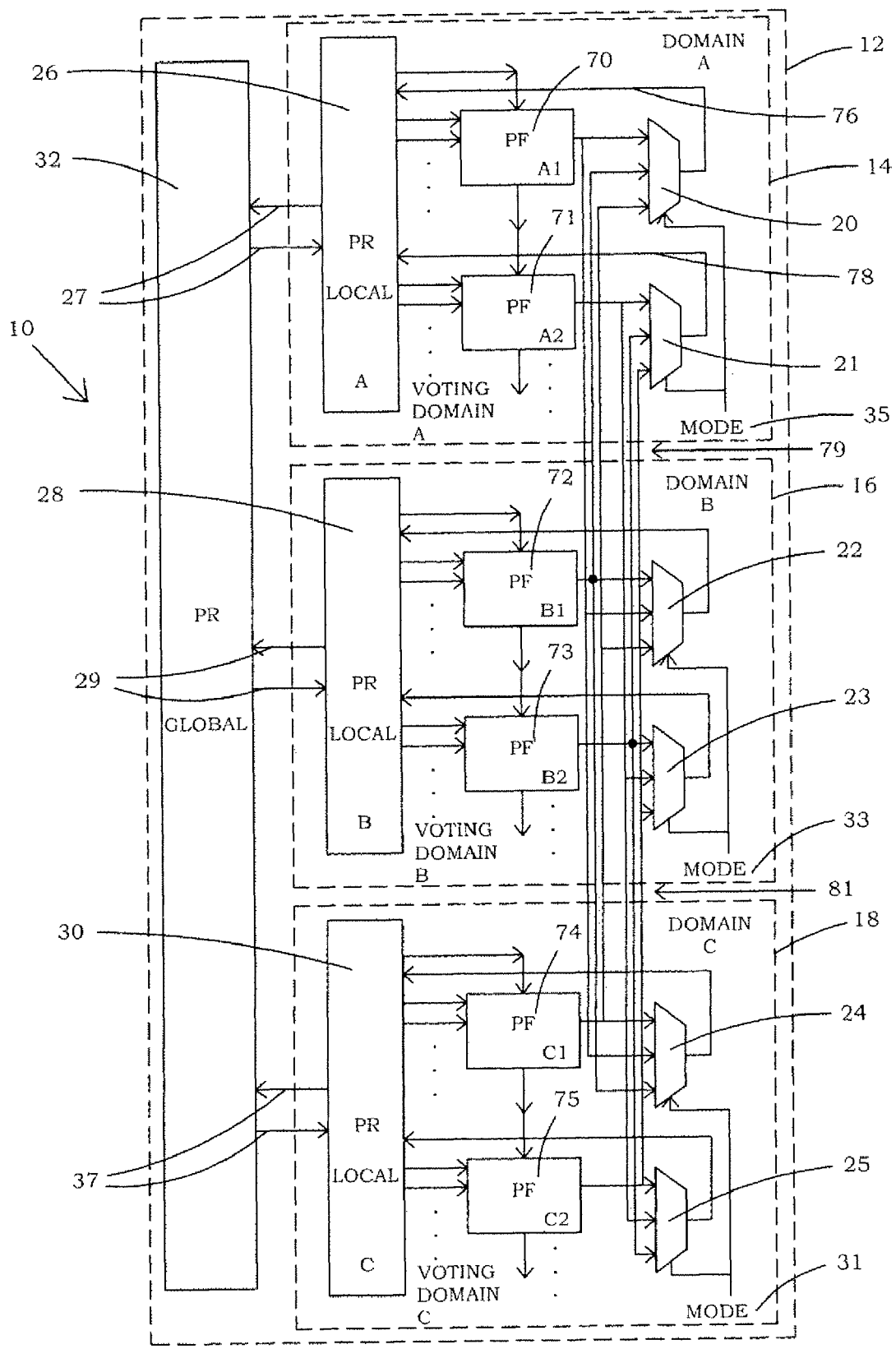
FIG. 1 is an electronic schematic block diagram of a PLD which permits reconfiguration of the SEU/SET tolerance in accord with one possible embodiment of the present invention.

Referring now to the drawings, and more particularly to FIG. 1, there is shown a programmable logic device (PLD) 10 with reconfigurable SEU/SET tolerance in accord with one possible embodiment of the present invention. An electronic circuit with a higher SEU/SET tolerance produces fewer uncorrected errors than an electronic circuit with a lower SEU/SET tolerance when operated in an environment bombarded by radiation particles that produce SEU/SETs.

FIG. 1 shows one possible "configurable reliability block" CRB 12. CRB 12 may represent one integrated circuit chip, or there could be a number of CRBs on a single chip. The smallest CRB determines the granularity at which the choice between TMR and split mode can be made.

While the present invention does not need to be laid out physically as shown in FIG. 1, an integrated circuit constructed in accord with the present invention may be laid out in blocks which are physically segregated from each other as indicated in FIG. 1, for reasons discussed hereinafter. As well, "blocks" as used herein, may also refer to circuitry which is physically set apart by some means, and may include being positioned on different integrated circuits, at different locations on the same integrated circuit, or being positioned in other circuitry. However, the present invention may also be utilized in integrated circuits that are not separated into blocks.

In this embodiment of CRB 12, there are three voting domains, A, B and C, indicated at 14, 16, and 18. Each voting domain has an arbitrary number of programmable function elements (PF) as indicated by the use of an ellipsis. For example, voting domain A may include any number of PF elements, such as PF elements 70 and 71. Voting domain B may include any number of PF elements, such as PF elements 72 and 73. Likewise, voting domain C may include any number of PF elements, such as PF elements 74 and 75.

In FIG. 1, PF elements 70, 72, and 74 are connected to the same voters, 20, 22, and 24. In the figures, when connection lines cross over one another, such "cross-overs" do not indicate a connection unless illustrated with a dot. For example, the connection line from PF element 72 to voter element 22 includes a dot over the intersection with a connection line that originates from PF element 64 and ultimately connects to voter elements 20 and 24. Thus, FIG. 1 is interpreted such that PF element 72 is operably connected to voter elements 20 and 24 in addition to voter element 22. In direct contrast, PF element 72 is not operably connected to voter elements 21, 23, and 25 because there are no dots associated with the connection line that extends from PE element 72 to voter element 22 wherein this connection line intersects with connection lines that are associated with voter elements 21, 23, and 25.

PF elements 71, 73, and 75 are connected to the same voters 21, 23, and 25. PF elements 70, 72, and 74 are not connected to voters 21, 23, and 25. Likewise PF elements 71, 73, and 75 are not connected to voters 20, 22, and 24. Thus, if voting domains A, B, and C are physically segregated and/or otherwise constructed to so that a single particle does not cause a SEU/SET in two domains at the same time, then TMR will provide reliable data flow through electronic circuit, which the PF elements are programmed to provide. In one embodiment, pre-wired non-switchable connections are utilized between the voters, as indicated at 79 and 81.

Figure 2:
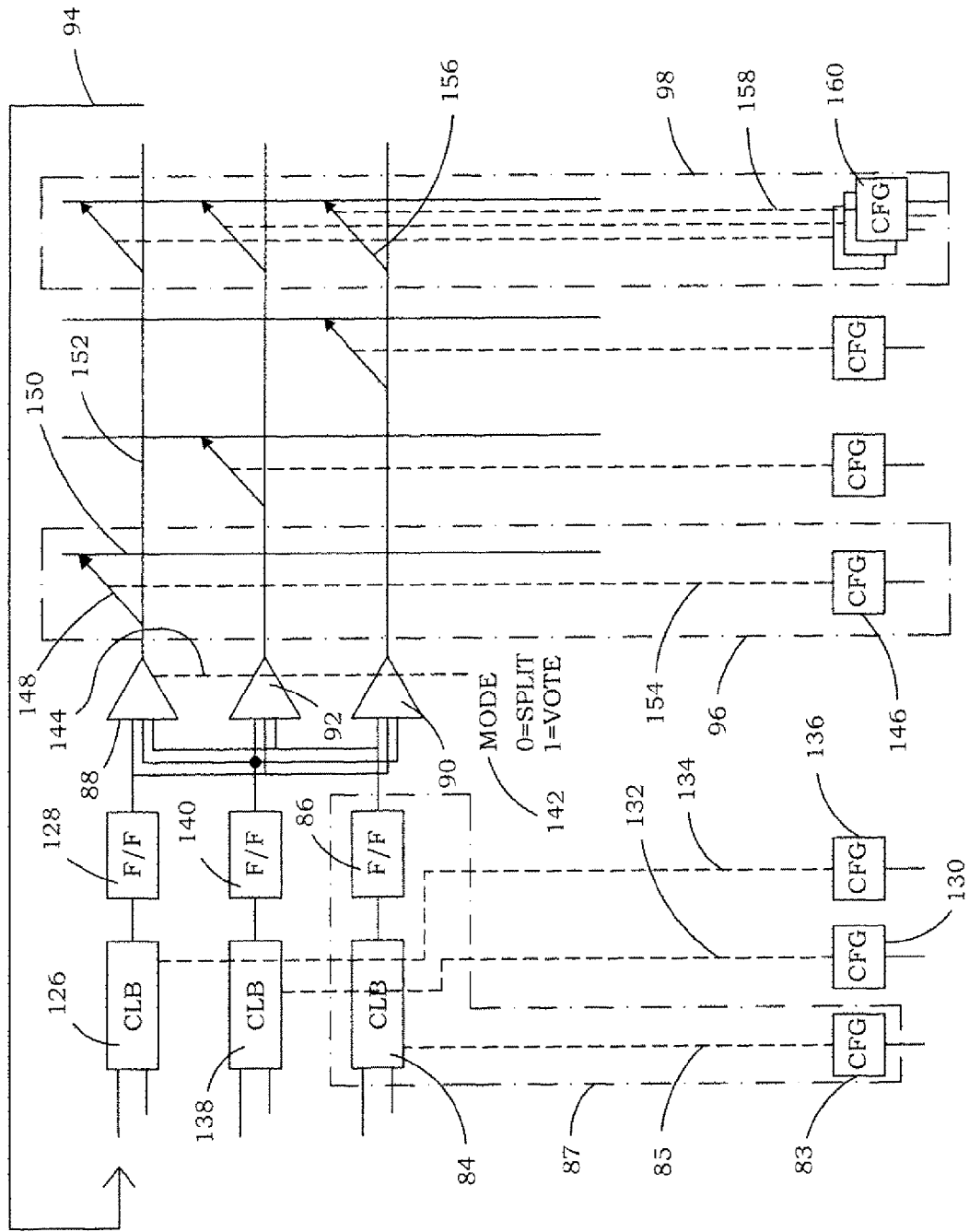
FIG. 2 is another electronic schematic block diagram of a PLD which permits reconfiguration of the SEU/SET tolerance showing a plurality of configuration bits and a plurality of programmable interconnections in accord with one possible embodiment of the present invention.

Another view of a reconfigurable integrated circuit in accord with the invention is shown with a different schematic layout in FIG. 2. FIG. 2 shows three hardware identical PF elements, such as PF element 87, connected to three voters, 88, 92, and 90. In FIG. 2, the dot-dash line surrounding components 83, 84, and 86 represent PF element 87 because PF 87 may be considered to comprise these components. PF elements may include various elements. For example, in this example PF element 87 comprises configuration memory 83, configurable logic block (CLB) 84 and flip/flop 86. Thus, FIG. 2 shows the PF elements therein in more detail than in FIG. 1. FIG. 2 also shows a plurality of programmable interconnections controlled by a plurality of configuration bits as discussed in more detail hereinafter.

Referring again to FIG. 1, outputs of the voters 20-25 are shown connected to corresponding local programmable routing (PR) networks A, B, and C, as indicated at 26, 28 and 30. A "routing network" may be comprised of a plurality of PR networks. Local PR networks can be utilized to reconfigure the routing of signals between TMR operation and single channel or split mode operation. More details of PR networks of programmable switches which allow the routing to be programmed for a particular desired electronic circuit application are discussed in connection with FIG. 5.

In FIG. 1, voter output 76 of voter 20 is connected to local PR network A. The same is true of voter output 78 of voter 21. In TMR mode of operation, this output may be utilized as feedback to correct errors in PF elements 70 and 71. In split-mode or single channel operation, outputs 76 and 78 are directed by local PR A routing network as desired for the particular application.

Mode controls 31, 33, and 35 are utilized to control the mode of operation of CRB 12. In this example, three mode controls are shown for redundancy. However, this is not the only possible way the mode controls could be protected and implemented.

To the extent that the PF elements comprise memory, such as configuration memory 83 shown in FIG. 2, some method has to be provided to detect and remove errors in the configuration memory, or to make the configuration memory error proof. Both approaches exist in the prior art, namely scrubbing for SRAM, or TMR for SRAM, or the use of FLASH or ANTIFUSE, which makes the configuration memory hardened against SEU/SET.

Examples of PF elements are discussed hereinbefore in the background section and may comprise those listed, or combinations of those, or other programmable elements not previously listed. Input/output may be part of the PF elements and/or part of the programmable routing networks.

If any of the PF elements are a type with internal state memory, such as BRAM or CPU elements, then these must have additional SEU/SET protection, as discussed below. Ordinary configurable logic blocks (CLB) and digital signal processing (DSP) type PF elements should be fully protected by the invention.

For operation with a triple modular redundancy (TMR) type of SEU/SET tolerance, the three voting domains A, B, and C are programmed identically. For use in a TMR mode, identical signals (assuming no SEU/SET) from the three PF elements are voted using groups of voters. For instance, in the example of FIG. 1, PF elements 70, 72 and 74 are majority voted using voters 20, 22, and 24. PF elements 71, 72, and 73 are majority voted using voters 21, 23, and 25. Any number of PF elements and associated voters may be utilized.

In one embodiment, when CRB 12 is implemented as part of a single integrated circuit, the three voting domains A, B, and C are physically segregated on the integrated circuit sufficiently to avoid the spread of an SEU/SET caused by a single particle from producing simultaneous errors in two voting domains. In other words, the components of each voting domain are physically separated from components of another voting domain by a distance greater than the likely spread distance of an SET or SEU.

The likely spread distance of an SEU/SET may be determined for a particular technology by testing a circuit using a cyclotron wherein heavy ions strike the device at various angles. For bulk silicon, it appears to the inventor that utilizing one micron as being "not near" would result in very rare, if any, hits that would cause errors in two voting domains at the same time. In other words, separating the voting domains by this distance in chips using bulk silicon would be effective to prevent a single SEU/SET causing an error in any two blocks at the same time.

The inventor has tested a TMR circuit in a chip with components spaced at 0.35 microns wherein the chip is built without regard to adjacency, and found zero errors even with the most energetic particles from a cyclotron. However, the same TMR circuit evaluated with a component spacing of 0.18 microns produced a few errors, though still well within an acceptable range. Circuits are currently being made with 0.045 micron component spacings, and most FPGAs are being made with 0.065 micron component spacings. Accordingly, it is believed that further deterioration of TMR performance may possibly occur in the future which can be avoided if the chips are built in accord with steps presented herein. However, the selective control of SEU/SET tolerance in accord with the present invention may be utilized in many circuits without regard to special integrated circuit component spacings and arrangements.

"Near" for this purpose means the "likely spread distance of an SET or SEU" in whatever chip technology is used. Therefore, "not near" means greater than "the likely spread distance of an SET or SEU." This distance is usually, but not necessarily, in the micron range. Depending on the type of technology the offset between voting domain switches may be of different values, e.g., greater or less than 0.5 microns, 1 micron, 3 microns, 4 microns, or 5 microns, and the like. In different technologies, the "likely spread distance of an SET or SEU" between local routing switches may be different, e.g., greater or less than 10 microns, etc. In other words, the likely spread distance of an SET or SEU is dependent on the technology. Moreover, with changing technologies and decreasing distances between components, the meaning of "near" or "likely spread distance of an SET or SEU" may change. "Likely" may be a probability of less than 90%, or less than 95%, or less than 99.99% or less than 99.99999%, or the like.

An error must occur in more than one voting domain to affect the result. Thus, the present invention may be laid out in physical blocks that are "not near", as that term is defined as above. Although various blocks are shown in FIG. 1, the physical layout of the blocks may be different from that shown in FIG. 1, and may include subdivided blocks within each block, as desired. For example, CRB 12 may be a "block" that is "not near" other CRBs, and may include other "blocks" therein, which are "not near" each other, such as voting domains A, B, and C. Moreover, global PR block 32 might be subdivided into blocks that are "not near" each other. The physical layout of an integrated circuit can be an important consideration of one possible embodiment of the present invention. However, the present invention can be utilized in many integrated circuits without special layout considerations.

In one embodiment, errors are unlikely to propagate to more than one of the voting domains A, B, and C due to SEU/SET errors caused in the switches of switchable interconnections between voting domains A, B, and C because all the switchable interconnections between the voting domains preferably utilize at least two switches that are "not near" each other. It is unlikely that such switches will be affected by the same SEU/SET. By "not near," as discussed above, it is meant that the switches are separated by a distance greater than the likely spread distance of an SET or SEU in order to maintain a desired acceptable fault tolerance of CRB 12.

CRB 12 can be connected to other CRB blocks in TMR mode, or to CRB blocks running in split mode with the option for multiple single channels. If connected to split mode blocks, the user is accepting the possibility of errors from the split mode blocks getting into the TMR block. Such errors may include data errors for which the application designer has another plan to handle, such as data averaging or error correction protocols.

To operate multiple blocks in TMR mode requires reliable communication internally within each block as well as between blocks in an environment subject to SEU/SET. Accordingly, one embodiment of the present invention may comprise local A, B and C programmable routing (PR) networks as shown by the embodiment of FIG. 1. Local programmable routing (PR) networks A, B, and C, as shown at 26, 28 and 30, may be utilized for communications internally within voting domains A, B and C, respectively. By local, it is meant, for example, that local programmable routing network A is utilized to provide routing exclusively or almost exclusively within voting domain A. Moreover, local programmable routing network A may preferably be physically located within the region of the chip which is designated for voting domain A or is preferably at least physically segregated so as to be "not near" to voting domains B and C, or local programmable routing networks B and C. Thus, referring to FIG. 1, a single SEU/SET that affects, for example, local PR network A switches, does not also affect voting domains B and C.

Routing within a voting section (A, B, C) has no constraint, other than that it be co-located with other elements of the same section, and "not near" a different section in the same voting group. Routing between voting sections, for example, from voting domain A to voting domain B, must follow the constraint that there be at least two switches and two configuration bits controlling those switches, and that those items be located "not near" each other. The configuration bits are discussed hereinafter. This condition may be satisfied by placing one configuration bit-switch pair within voting domain A and one within voting domain B, but also possibly in other ways.

For a TMR operation mode, local PR networks A, B, and C would need to be extended to connect with local PR networks A, B and C of other CRBs (not shown). In one possible embodiment, such connections may be made though global PR network 32, as indicated by connections 27, 29, and 37. In another possible embodiment, connections may be made directly between voting domains A, B, and C. Rules for preventing a single SEU/SET from affecting two voting domains of global PR are discussed hereinafter. Thus, in one embodiment of the invention, programmable routing networks in accord with the present invention can be organized into global and local programmable networks. However, the invention is not limited to this particular organization. Moreover, depending on the embodiments, which may become complicated, there may be exceptions to this organization of programmable routing networks. Moreover, in some cases local programmable networks may communicate directly to each other instead of through global PR network 32 in accord with the rules discussed hereinafter, e.g., by connection through at least two switches that are "not near" each other.

Figure 5:
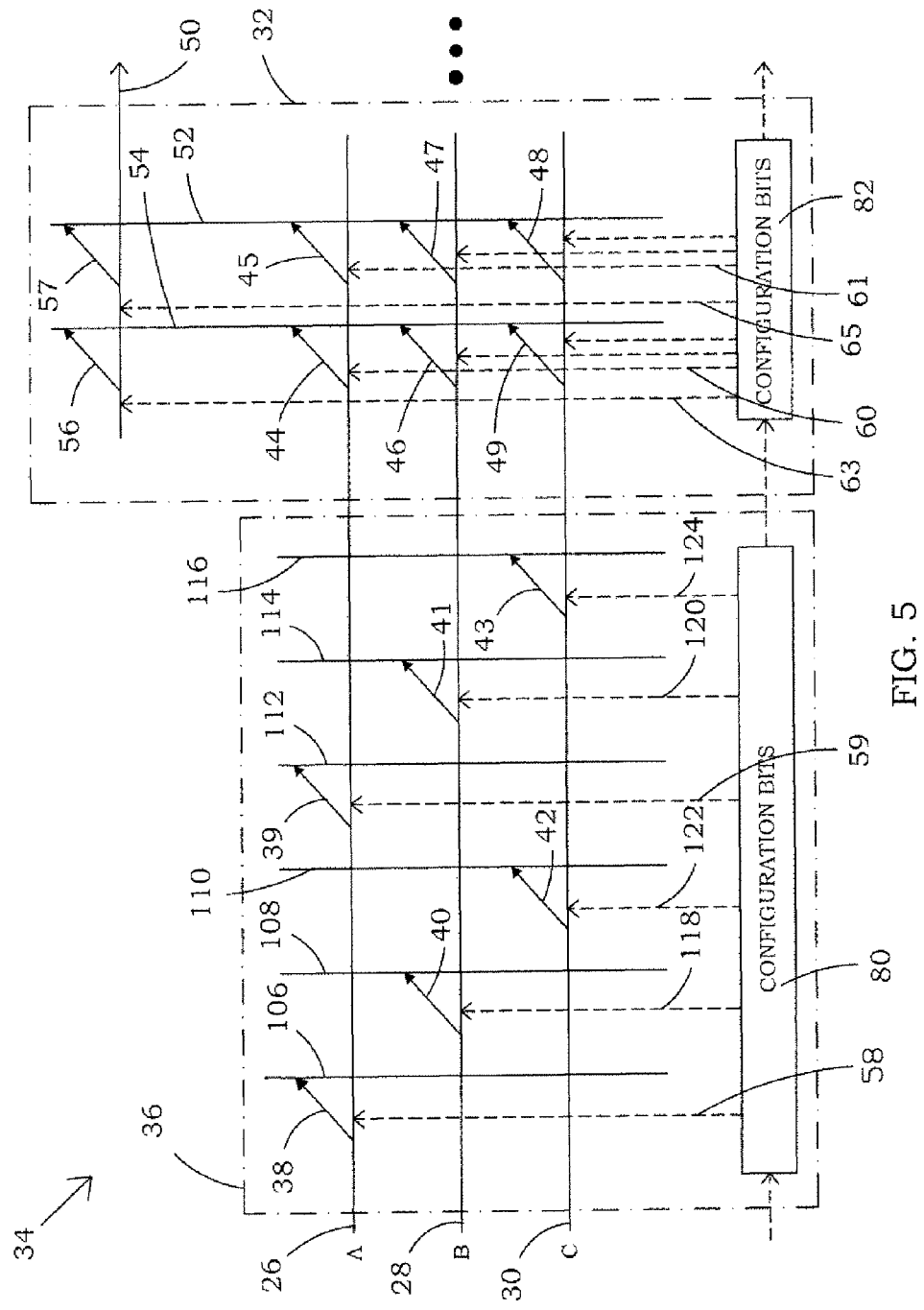
FIG. 5 is an electronic schematic diagram which shows possible details of local and global programmable routing (PR) networks which provide a plurality of programmable interconnections controlled by a plurality of configuration bits in accord with one possible embodiment of the present invention.

A simplified example of programmable routing organization, referred to as routing resource 34, is shown in FIG. 5. Routing resource 34 shows one possible embodiment of routing switches that provide partitioned safe routing.

For the sake of convention in the present application, it will be understood that symbols for switches are shown by an arrow, such as that indicated at numeral 38. A configuration bit, as indicated by dashed line 58 is utilized to control the on-off position of the particular switch. A user of the programmable circuit programs the configuration bits to control the network of switches. If switch 38 is on, then a connection is made between the conductor at the base of the arrow, as indicated by line 26, and another conductor at the tip of the arrow, as indicated by vertical line 106. Then the signal is transferred from line 26 to line 106. If switch 38 were off, then no connection is made to vertical line 106. In either case the signal continues to travel along line 26. For example, in FIG. 5, a signal path is indicated by a darkened line 26 which continues until reaching switch 44. Switch 44 is on, so the signal switches to the path of darkened line 54 upwardly to switch 56, which is also on. Therefore, switch 56 switches the signal path to the horizontal line indicated by numeral 50 from the vertical line 54 whereby the signal now ceases going upwardly and continues towards the end of the line with the numeral 50.

Shown for convenience on the left of routing resource 34 is local routing 36 which may be utilized as local PR networks A, B, and C, as indicated at 26, 28, and 30 in FIG. 1, for voting domains A, B, and C, as indicated at 14, 16, and 18 in FIG. 1. However, it will be understood that the physical layout of an integrated circuit may be quite different than the electronic layout of schematic of FIG. 5. It will also be understood that routing resource 34 may be utilized for other purposes, such as providing more reliable redundancy in circuitry which is provided without pre-wired redundancy.

Local programmable routing network 36 may comprise any number of wires, switches, and configuration bits for each voting domain such as local programmable routing groups of switches 38-43, conductors 26, 28, 30, configuration bits 80, and conductors 106, 108, 110, 112, 114, 116 (hereinafter 106-116). It will be understood, for example, that switches 38-43 may represent many switches, any one of which may be open or closed in a given configuration based on configuration bits, such as voting domain A configuration bits 58 and 59, which may represent many configuration bits. The orientation of conductors only in the horizontal and vertical in the drawing provides no limitations on their orientations in a circuit layout. Other switches, configuration bits, and conductors in FIG. 5 such as in global PR network 32 may also represent many switches, configuration bits, and conductors.

In the example of FIG. 5, conductors 106-116 are shown to each be connecting to switches only within a particular voting domain A, B, or C. Thus, the switches in voting domain A, such as switches 38 and 39, may represent any number of switches found only within voting domain A, and lines such as line 26, 106, and 112 may represent any number of conductors found only within voting domain A. Configuration bits 58 and 59 may also represent any number of configuration bits, which may be located within voting domain A. These switches, configuration bits, and conductors can be utilized as local PR A to program various desired interconnections within voting domain A, depending on the application.

Accordingly, in one possible embodiment for partitioned safe routing, local PR network A, as symbolized or indicated at 26, 38, 39, 58, 59, 106 and 112 may only be utilized for programmable connections within voting domain A. This also true for local PR network B, as symbolized or indicated at 28, 40, 41, 118, 120, 108, and 114. The same can be said of local PR network C, as indicated at 30, 42, 43, 122, 124, 110, and 116.

The separation of local programmable routing networks, such as local PR networks A, B, and C, may increase the SEU/SET tolerance of an integrated circuit. In one embodiment of the invention, the switches of different voting domains can be segregated to protect against the spread of a SET or SEU. For example, local PR network A switches 38 and 39 are "not near" local PR network B switches 40 and 41 or local PR network C switches 42 and 43. Likewise, local PR network A configuration bits 58 and 59 are "not near" local PR B configuration bits 118 and 120 or local PR network C configuration bits 122 and 124.

As discussed above, the physical layout of local PR network switches 38-42 in an integrated circuit may be quite different than the circuit diagram shown in FIG. 5. For instance, local programmable routing network A switches 38 may be positioned on one side of an integrated circuit while local programmable routing network B switches 40 are positioned on another side, and so forth.

Shown for convenience on the right of the circuit diagram of routing resources 34 in FIG. 5 is a global programmable routing (PR) network, which in this example may correspond to global PR network 32, of FIG. 1. Routing resources 34 provides a plurality of programmable interconnections in the form of a network of switches controlled by a plurality of configuration bits. Global PR network switches, which are utilized as programmable interconnections, may have the same constraints discussed above. There can be any number of global PR switches, conductors, and configuration bits. Global PR network A switches 44 and 45 are "not near" global routing network B switches 46 and 47 or global routing network C switches 48 and 49. Likewise, global routing network B switches 46 and 47 are not "near" global routing network C switches 48 and 49. The same is true for the corresponding configuration bits. As an example, this condition can be easily met within this embodiment by positioning switches and configuration bits connecting PF or PR A elements to the PR global routing physically within block A, likewise positioning the switches and configuration bits for connecting B and C elements to the global network within the blocks B and C. For higher level global routing that will be used to connect one A voting domain to other A voting domains, or likewise for B and C voting domains, this segregation can be maintained in like manner, by providing dedicated A, B and C regions in the system global routing for location of routing switches. Again, the physical layout of the global routing switches in an integrated circuit may be quite different from the circuit diagram layout shown in FIG. 5. Other switches, such as switches 56 and 57 and their corresponding configuration bits, may also be segregated.

In one possible embodiment, as mentioned above, no voting domain is allowed to be connected to another voting domain by a single switch. While output signal 50 on the right of PR 32 may be connected to any voting domain A, B or C, assume for example, that output signal 50 is connected to voting domain B. Therefore, a potential connection exists between voting domain A and voting domain B when the connection may not be desirable depending on the mode of operation of the circuit. If the connection is completed by a single switch which is hit by an SEU/SET, this may potentially affect both voting domain A and voting domain B. One rule in accord with a possible embodiment of the invention requires at least two "not-near" switches to make a connection between voting domain A and voting domain B utilizing an intermediate link.

For example, in split mode operation, a connection may be desirable through global programmable routing network domain A switch 44, which is connected to intermediate link 54, and corresponding global programmable routing network domain B (in this case) switch 56, which is also connected to intermediate link 54. Both switches 44 and 56 have to be closed to make this connection between voting domain A and voting domain B. Because switches 44 and 56 are not near each other, it is unlikely that an SEU/SET would trigger both switches simultaneously to inadvertently produce a connection between voting domain A and voting domain B.

Connecting between two different voting domains with a single switch would violate the separation rules in accord with one embodiment of the invention because if one switch failed due to an SEU/SET then a connection between two domains might inadvertently be made. Accordingly, connections between two different voting domains require at least one intermediate link or conductor, such as intermediate links 52 and 54, and at least two switches. Another connection may utilize, for example, link 52 and switches 45 and 57, which are connected to opposite sides of link 52. As noted above, the corresponding two switches are "not near" each other and utilize an intermediate link to connect between two voting domains.

In the circuit diagram of FIG. 5, intermediate links 52 and 54 are shown as vertical wires, although their physical orientation and length is variable. Because two switches, such as switches 44 and 56, are "not near" each other, they are unlikely to fail at the same time due to the same SEU/SET. One possible way of providing this separation is to locate each switch with the voting domain it serves, identified by its horizontal row. Thus, a connection is available if desired but is not inadvertently made when it is not desired.

In one embodiment, the associated configuration bits which control the switches for programmable networks must follow the same not-near rules. In this embodiment, the configuration bits may be segregated between local programmable network configuration bits 80 and global programmable network configuration bits 82, and may be further segregated as switches associated with voting domains A, B, and C. Any switches associated with configuration bits 63 and 60, for example, which operate switches 56 and 44, respectively, must be "not near" each other. This tends to happen naturally if resources are physically segregated into blocks on an integrated circuit, as shown in FIG. 1. Likewise, configuration bits 65 and 61, which operate switches 57 and 45, respectively, must be "not near" each other. Furthermore, switches for configuration bits 58 and 60, which are in the local and global networks, are "not near" each other, in at least in one possible embodiment of the invention.

For TMR operation, in one embodiment, all global domain network 32 switches that would otherwise connect between the voting domains during split operation are off. Therefore, at least two switches which are "not near" each other, such as switches 44 and 56, would have to fail for a fault to be propagated between voting domains A and B. Since these switches and their configuration bits are "not near" each other, this cannot happen because a SET or SEU by hypothesis, are "single" events.

As indicated at 79 and 81, in FIG. 1, connections between the voters provide non-switchable connections between the domains. In one embodiment, these connections may be permanently pre-wired by the manufacturer. In other words, lands without switches may be used to connect the voters together.

In split operation, which may also be referred to as single channel operation, switches in global PR network 32 may be utilized to pass data between voting domains A, B, and C, because different domains may be working on different parts of the same problem.

The routing scheme shown in FIG. 5 may be utilized without the hardware voting scheme shown in FIG. 1. For example, if a conventional FPGA used routing physically partitioned in this way on the integrated circuit, along with firmware TMR, and the tools constructing the firmware TMR took advantage of the physical partitioning, then the resulting application may be far less susceptible to single event errors. If done well, the circuit might have no susceptibility to single event errors. It would not have the speed and efficiency advantage of the hardware voters, of course, if they were not present.

It will also be understood that although the above described routing is believed to be useful for the configurable SEU/SET tolerance circuitry of the invention, other types of routing may be utilized. It will also be understood that routing often becomes very complicated, with wires of many lengths, and the like. However, in the above-described routing configuration, it is only necessary that the rules outlined be followed. For example, two switches which are not "near" each other are used with an intermediate link to make a connection between voting domains.

Figure 4A:
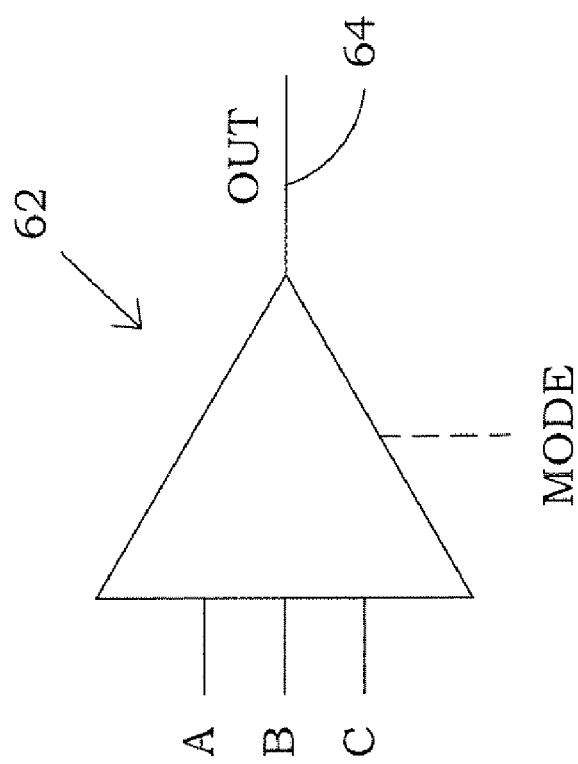
FIG. 4A is an electronic schematic diagram which shows a voter with mode control which may utilize outputs of programmable function elements and/or configuration memory in accord with one possible embodiment of the present invention.
Figure 4B:
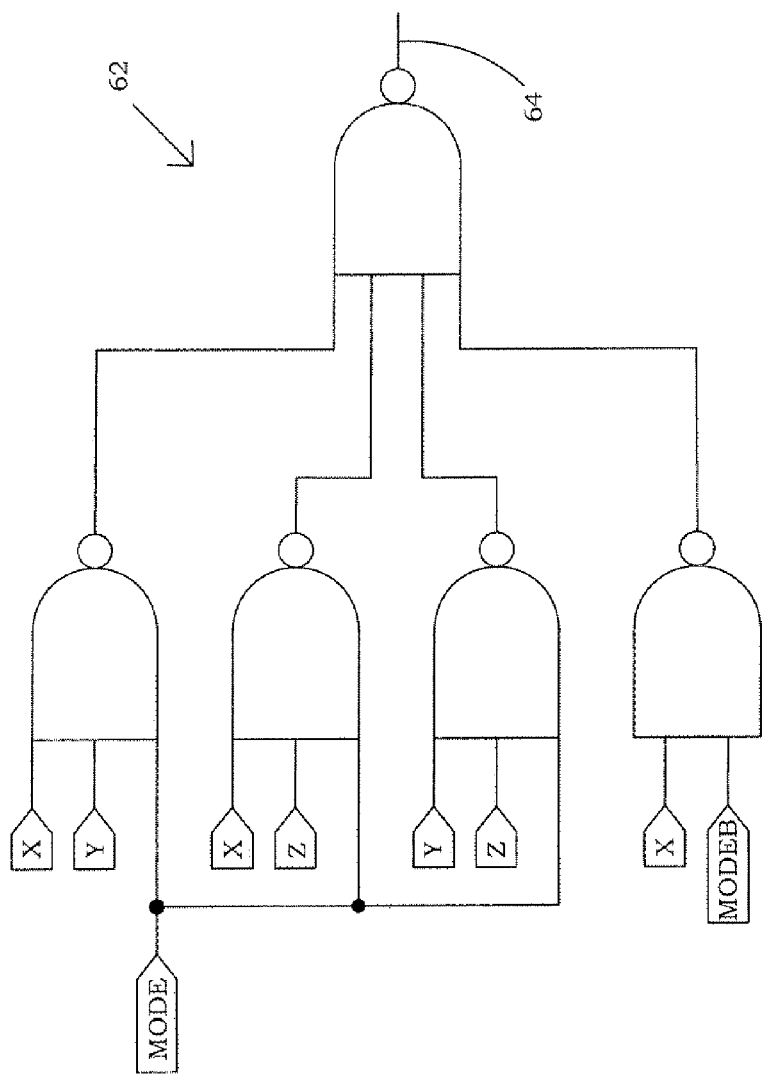
FIG. 4B is a more detailed electronic schematic diagram of one possible non-limiting configuration of the voter of FIG. 4A in accord with one possible embodiment of the present invention.

FIGS. 4A, 4B, and 4C show examples of a possible mode controlled voter 62, which may be utilized as mode controlled voters 20-25 of FIG. 1. In one embodiment, signals of programmable functional (PF) elements that process data and produce an output may be inputs A, B, and C to voter 62, as suggested in FIG. 4A. Output 64 depends upon the mode in which mode controlled voter 62 is operating, either voted or split mode. The mode of operation may also be referred to as TMR operation, which is voted, or single channel, which is a split mode of operation that is not voted.

Referring to the truth table of FIG. 4C, if the mode signal is a logic 1, then the output is the same as the majority when there is a difference in the signals. On the other hand, if the mode control signal is a logic 0, then the output is the same as one of the inputs. In this example, the output is always the same as that which comes from input A. However, the output of mode controlled voter 62 could be the same as any particular input. In other words, the output 64 of mode controlled voter 62 may either be voted or not voted. In this way, each voting domain may operate independently in a separate channel from the other voting domains, or may be interconnected to operate in a TMR mode depending on the mode control.

FIG. 4B shows a logic circuit comprised of NAND gates which may be utilized to implement the truth table of FIG. 4C. If the mode switch is set to 0, then MODEB will be 1, and the output will always be x. If the mode switch is set to 0, then the output with be the majority of x, y, and z. Other logic circuits may also be utilized to implement the truth table of FIG. 4C.

Referring to FIG. 1, mode control 31, 33, and 35 may be applied to mode controlled voters 20-25 in triplicate. However, the mode signal can be made reliable by any one of a number of means. The origin of the mode control could be internal or external to CFR 12. If external, the granularity (or number of reconfigurable reliability blocks (CFR) 12) would have some limit due to a pin being needed for each one. If internal, the mode would presumably be made of the same thing as the rest of the chip's configuration memory. If the configuration memory technology is vulnerable to SET or SEU, then the mode control needs to be heavily mitigated, since a mode error could introduce errors into the functional results if it affected voters in different voting domains. An example of vulnerable configuration memory is SRAM. An example of not vulnerable configuration memory is FLASH. However, even in the case of not-vulnerable memory, SETs in the connecting logic are possible. One way to make the mode line SEU/SET tolerant is to triplicate it along with everything else. However, the mode control does not necessarily need to be voted. For example, it may simply be provided in triplicate. If the configuration memory is vulnerable, then both the memory and the connecting logic should be triplicated. In one embodiment, the present invention assumes there will be separate configuration memory for everything in separate voting domains, including the mode control. The mode control may or may not be designed to be changed during operation.

Referring to FIG. 2, there is shown another electronic block diagram of PLD 10 that may be utilized to describe an embodiment of the present invention. PLD 10 may comprise three (or many more) programmable function (PF) elements, wherein each PF element might comprise a configurable logic block, flip/flop, and configuration memory or might comprise other elements. The dot-dash line at 87 encircles the components for PF element 87. In this example, a first PF element 87 may comprise configuration memory 83, control logic block 84, and flip/flop 86. The output of this PF element 87 goes to three voters 88, 90, and 92. The three PF elements shown in FIG. 2 may, for example only, correspond to PF elements 70, 72 and 74 in FIG. 1, and the three voters may correspond to 20, 22, and 24. In this example, dashed line 85 indicates that configuration memory 83 is utilized to program configurable logic block 84. Likewise, dashed line 132 indicates that configuration memory 130 is utilized to program configuration logic block 138. It is noted that dashed line 132 overlaps configuration logic block 84. This overlap is for illustrative convenience and serves no functional representation. Stated otherwise, configuration memory 130 is not utilized to program configuration logic block 84. Similarly, dashed line 134 is used to indicate that configuration memory 136 is utilized to program configuration logic block 126. And, although dashed line 134 overlaps both configuration blocks 84 and 138, these overlaps are for illustrative convenience only. In general for all figures, such overlaps are for illustrative convenience only and serve no functional representation. Stated otherwise, configuration block 136 is not utilized to program configuration logic blocks 84 or 138.

Another PF element may comprise control logic block 126, configuration memory 136 and flip/flop 128. This PF element is also connected to voters 88, 90, and 92. Another PF element may comprise configuration memory 130, CLB 138, and flip/flop 140. This PF element also electrically connects to voters 88, 90, and 92.

Voters 88, 90, and 92 are mode controlled voters as discussed hereinbefore. Mode control 142 is used to control the voters and is applied to each of voters 88, 90, and 92 as indicated by dashed line 144. In this case, when mode control 142 is a logic zero, then the programmable function elements operate in the split mode of operation. When mode control 142 is a logic one, then the programmable function elements operate in a majority voted mode, which in this case is also a TMR mode of operation.

In TMR operation, feedback 94 may be utilized to provide correction information for the PF elements when so directed by local programmable routing network 96. Numeral 96 represents configuration bits and switches and conductors for a local programmable routing network such as local programmable routing network A. This is comparable to FIG. 1, where local programmable routing network A might be utilized for directing feedback in TMR utilizing the voter output on line 76. This is also comparable to FIG. 5, where components 26, 38, 39 58, 59, 106 and 112 represented local programmable routing network A.

As discussed previously, it will be understood that configuration bit (CFG) 146 in FIG. 2 controls switch 148, as indicated by dashed line 154. Switch 148 switches between conductor 150 and conductor 152, as discussed previously in connection with FIG. 5. It will also be understood that switch 148, CFG bit 146, conductors 150 and 152 represent any number of switches, configuration bits and conductors. Local PR network A can then selectively be connected to conductor 94 (by switches not shown in FIG. 2) to direct conductor 94 to other locations or to utilize conductor 94 as feedback for correcting errors in associated PF element. Although local programmable routing (PR) network B and C are not indicated by dashed lines, their components are comparable to that discussed directly above for local PR network A. Refer also to the discussion of FIG. 5 for more details about local PR network B and C routing.

Global PR network 98 may be utilized in split mode operation to connect various programmable function members together and/or make other connections may be largely or may be completely disconnected in TMR operation. FIG. 2 provides a different circuit level view of an embodiment of the invention as compared to that shown FIG. 1 or FIG. 3. As discussed in connection with FIG. 5, it will be understood that configuration bits, such as configuration bit 160, are utilized to control particular switches, such as switch 156, as indicated by dashed line 158. Further details of a possible global network are discussed above in connection with FIG. 5.

In TMR mode of FIG. 2, all PF elements would be configured identically and operate on identical data and the results would be voted to eliminate errors. In split-mode operation the PF elements may be configured differently, operate on different data, and produce different results.

The flip flops (F/Fs), such as flip-flop 86, are updated on every clock cycle. Therefore, no errors persist in them. Any memory in the PF elements, such as configuration memory 83, which is not updated from the input data on each clock, will require some method to protect that data, e.g., scrubbing, error correcting codes, voting, re-synchronization, and the like.

As discussed above in the background section, a PF element does not have to comprise a CLB and one or more F/Fs as shown in FIG. 2. For example a PF element may comprise a digital signal processing (DSP) element. A DSP element would operate in a similar manner, although the logic is more complex, with a multiplier and an adder, and many flip flops. In that case, every flip flop is updated on each clock and is voted as shown.

If a PF element comprises a memory element, usually called BRAM for block random access memory, then it would contain memory that was not updated from the input data on each cycle, and like the configuration memory, this would have to be protected by other means.

If a PF element comprises a CPU element it would have various state information, such as a program counter, an instruction pipeline, and perhaps a cache, that would not be freshly updated from input data on each clock. These memory elements would have to be protected in some other way.

Normally, a CPU would be re-synchronized when it failed a vote. It would go through some process to re-synchronize itself with the other CPUs. This might be as simple, for example, as flagging its cache and instruction pipeline as invalid, so they would be reloaded. Resynchronization could also be used with configuration memory or block RAM, if the means were provided to accomplish it.

Figure 3:
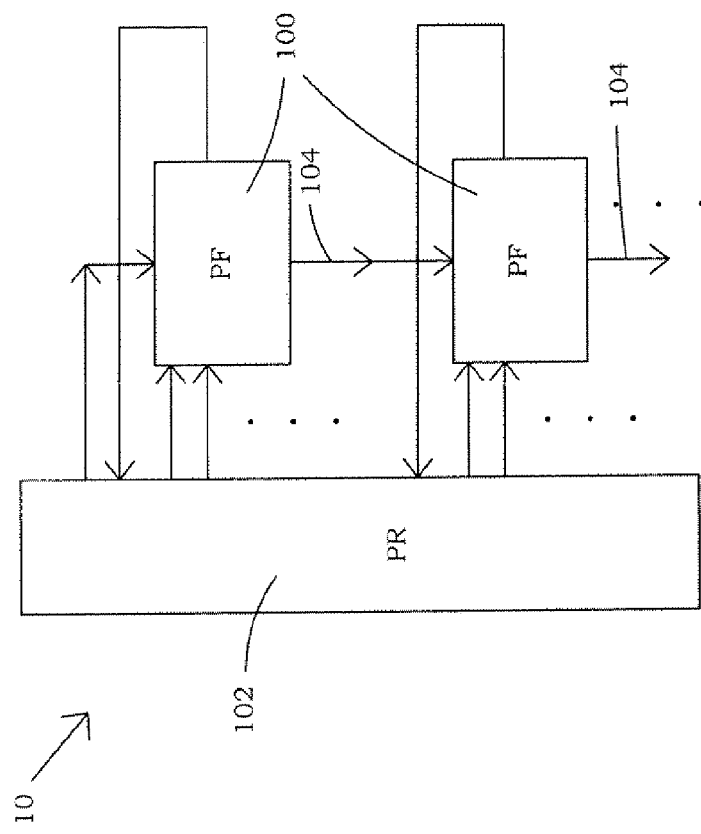
FIG. 3 is a generalized electronic schematic block diagram of a PLD which permits reconfiguration of the SEU/SET tolerance in accord with one possible embodiment of the present invention.

FIG. 3 shows a generalized view of PLD 10 with programmable routing network with partitioned safe routing interconnected with any number of programmable function elements 100. FIG. 3 configuration memory and I/O may be provided as part of programmable routing 102 and/or programmable functional elements 100. As discussed above, programmable function elements could comprise various elements such as, but not limited to look up table (LUT) based CLBs, DSP blocks, and/or the like. Programmable function elements could also be BRAM elements and/or CPU elements, given the caveat above that their state memory would have to be separately treated in any redundancy scheme.

Each wire in FIG. 3 could represent many wires. Programmable routing resource 102 could be any type of routing, which may or may not comprise routing resource 34 described above. Programmable routing resource 102 may be distributed around programmable function blocks 100. An example of some carry or shift or other direct block to block data paths 104 are shown vertically.

In summary of operation, as discussed above, the present invention provides circuitry which operates in a redundant mode and in a split mode. In redundancy mode, the voters produce an output corresponding to the majority of inputs which agree. In the split mode, the voters select just one input and convey this to the output, ignoring the other Inputs.

For fault tolerance, it is assumed that faults will occur within only one section of a voting group within one voting cycle, and thus the fault can be eliminated by majority voting. Three voters are used when the type of redundancy is TMR, providing three values to the next voting group, and so on, with the entire device triplicated. By changing the mode of operation of the voters, the sections can operate either in a TMR mode or independently.

When CRB 12 is operated in a TMR mode of operation, as discussed hereinbefore, the programmable function elements of each domain are programmed identically. In split mode operation, this is not necessary. For instance, configuration memory, as shown in FIG. 2, may be utilized to program the programmable function elements to perform different functions. However, when operated in TMR mode of operation the programmable function elements of the three voting domains are programmed identically. When operated in split mode, each PF element may perform different functions or may cooperate with each other to provide an application.

The present invention preferably allows all programmable elements which must be independent, whether function blocks or routing blocks, to be easily identified and placed in separated areas at the time the chip is designed. This organization helps provide SEU/SET protection even with more densely packed modern designs of PLDs. With smaller feature sizes on chips that are presently available, multi-node upsets have become the issue of the day. In prior art densely packed devices, multi-node upsets cannot simply be avoided by programming in redundancy via firmware. In presently available integrated circuits, two items that a designer attempts to provide as "independent" might be adjacent, and might be upset by a single particle strike. In the present invention, components intended to be independent components are not "near" each other, as discussed hereinbefore.

In accord with the TMR embodiment of the invention, when operated in the split mode of operation, effectively three times the resources are available. Since the only cost of this method is the voters (the constraints on the routing network are probably inconsequential), and since most of the chip may be comprised of configuration memory, up to 90% or even greater, the overhead of including the voters is small, possibly less than 5%.

Hardware TMR saves at least one "logic level" over firmware redundancy, providing hardware redundancy performance without sacrificing necessary capacity. At least two configuration bit errors are required to circumvent the voters, so configuration memory does not have to be separately voted.

The reconfigurable design enables a PLD, such as a FPGA, to serve broader applications. There is a lower manufacturing cost for end users. The higher capacity mode for the split-mode operation allows smaller FPGAs for end users, reducing unit and circuit board costs significantly. Moreover, when TMR is needed the end users have lower development costs because there is no need to implement TMR into firmware. This also shortens the required design time.

The present invention might also be utilized in other redundant circuits. For example, in a dual redundant system instead of a triple redundant system. In this case, instead of a voter, some means to latch or gate a state update only when both inputs agree may be provided. In this case, the latch or gate would operate as normally in a dual redundant mode, and would separately latch or gate the inputs in a non-redundant mode.

While a few exemplary embodiments of this invention have been described in detail above, a person skilled in the art will readily appreciate that many modifications are possible in the exemplary embodiments without materially departing from the novel teachings and advantages of this invention.

Accordingly, all such modifications are intended to be included within the scope of this invention as defined in the following claims. In the claims, any means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A reconfigurable integrated circuit, comprising:
a plurality of programmable functional elements operable to be programmed to form at least one electronic circuit;
a plurality of voters electrically connected to said plurality of programmable functional elements; and
a mode control operably connected to said plurality of voters for adjusting a SEU/SET tolerance of said at least one electronic circuit,
whereby in a first mode of operation, said at least one electronic circuit has a relatively lower SEU/SET tolerance, and
whereby in a second mode of operation, said at least electronic circuit has a relatively higher SEU/SET tolerance.

2. The reconfigurable integrated circuit of claim 1, further comprising a plurality of programmable routing networks operably connected to said plurality of programmable functional elements and said plurality of voters.

3. The reconfigurable integrated circuit of claim 1, wherein in said first mode of operation said plurality of programmable functional elements are programmable for performing different data processing functions.

4. The reconfigurable integrated circuit of claim 1, wherein in said second mode of operation said plurality of programmable functional elements are identically programmable to operate in a triple redundant mode of operation.

5. The reconfigurable integrated circuit of claim 1,
wherein said plurality of voters is comprised of a first, second, and third voter and wherein said plurality of programmable functional elements is comprised of a first, second, and third programmable functional element,
wherein said first voter and said first programmable functional element are organized in a first voting domain,
wherein said second voter and said second programmable functional element are organized in a second voting domain,
wherein said third voter and said third programmable functional element are organized in a third voting domain, wherein said first, second, and third voters are operably connected to said first, second, and third programmable functional elements, wherein in said first mode of operation said first, second, and third programmable functional elements are programmable for performing different data processing functions, wherein in said second mode of operation said first, second, and third programmable functional elements are identically programmable to operate in a triple redundant mode of operation, and wherein said at least one electronic circuit can be in either the said first mode of operation or the said second mode of operation.

6. The reconfigurable integrated circuit of claim 5, further comprising a first, second, and third local programmable routing network, wherein said first, second, and third local programmable routing networks are organized in said first, second, and third voting domains, respectively, wherein said first, second, and third local programmable routing networks are operably connected to said first, second, and third programmable functional elements, respectively.

7. The reconfigurable integrated circuit of claim 6, further comprising a global programmable routing network operably connected to said first, second, and third local programmable routing networks.

8. The reconfigurable integrated circuit of claim 6, further comprising a global programmable routing network operably connected to said first, second, and third local programmable routing networks by a first, second, and third set of at least two switches, respectively, and wherein said first, second, and third set of at least two switches are spaced apart by at least one micron relative to each other.

9. The reconfigurable integrated circuit of claim 1, further comprising a plurality of blocks, wherein said plurality of programmable functional elements and said plurality of voters are organized into said plurality of blocks, wherein each of said plurality of blocks are sufficiently physically separated from others of said plurality of blocks to prevent a single SEU/SET causing an error in any two of said plurality of blocks at the same time.

10. The reconfigurable integrated circuit of claim 9, further comprising each of said plurality of blocks being separated from said others of said plurality of blocks by at least one micron.

11. The reconfigurable integrated circuit of claim 9, further comprising a plurality of non-switchable electrical connections operably connected to a predetermined set of said plurality of voters in said plurality of blocks.

12. The reconfigurable integrated circuit of claim 9, further comprising one or more switchable connections operably connecting said plurality of blocks, each of said one or more switchable connections comprising at least two switches.

13. The reconfigurable integrated circuit of claim 12, wherein said at least two switches are spaced apart by at least one micron.

14. A method for making a reconfigurable integrated circuit, comprising the steps of:

providing a plurality of programmable functional elements which are operable to be programmed to form at least one electronic circuit;

electrically connecting a plurality of voters to said plurality of programmable functional elements; and electrically connecting a mode control to said plurality of voters for adjusting a SEU/SET tolerance of said at least one electronic circuit whereby in a first mode of operation said at least one electronic circuit has a relatively lower SEU/SET tolerance and whereby in a second mode of operation said at least one electronic circuit has a relatively higher SEU/SET tolerance.

15. The method of claim 14, whereby in said first mode of operation said plurality of programmable functional elements are selectively programmable to perform different functions.

16. The method of claim 14, whereby in said second mode of operation said plurality of programmable functional elements are identically programmable to provide a triple redundant mode of operation.

17. The method of claim 14, further comprising the step of operably connecting a first set of three of said plurality of voters to each of a first set of three of said plurality of programmable functional elements, and operably connecting a second set of three of said plurality of voters to each of a second set of three of said plurality of programmable functional elements.

18. The method of claim 14, further comprising the step of organizing said plurality of programmable functional elements and said plurality of voters into a plurality of blocks, and providing that each block of said plurality of blocks is sufficiently physically separated from others of said plurality of blocks to prevent a single SEU/SET causing an error in two blocks at the same time.

19. The method of claim 18, whereby each of said plurality of blocks is at least one micron from others of said plurality of blocks.

20. The method of claim 18, further comprising the step of installing one or more switchable connections for operably connecting said plurality of blocks such that each of said one or more switchable connections comprise at least two switches.

21. The method of claim 20, further comprising the step of sufficiently physically separating said at least two switches from each other to prevent a single SEU/SET causing an error in said at least two switches at the same time.

22. A method for operating a reconfigurable integrated circuit, comprising the steps of:

providing a reconfigurable integrated circuit, comprising:

a plurality of programmable functional elements;

a plurality of voters electrically connected to said plurality of programmable functional elements; and a mode control operably connected to said plurality of voters;

programming said plurality of programmable functional elements to form at least one electronic circuit; and setting said mode control connected to said plurality of voters to adjust a SEU/SET tolerance of said at least one electronic circuit, whereby in a first mode of operation said at least one electronic circuit has a relatively lower SEU/SET tolerance and in a second mode of operation said at least one electronic circuit has a relatively higher SEU/SET tolerance.

23. The method of claim 22, further comprising the step of selecting an output from each of said programmable functional elements without majority voting in said first mode of operation.

24. The method of claim 22, further comprising the step of majority voting outputs from each of said plurality of functional elements in said second mode of operation.

25. The method of claim 22, further comprising the step of programming said plurality of programmable functional elements to perform two or more different functions in said first mode of operation.

26. The method of claim 22, further comprising the step of programming said plurality of functional elements identically when said second mode of operation is selected.

27. The method claim 22, further comprising the step of operating said plurality of programmable functional elements to provide a triple redundant mode of operation in said second mode of operation.

28. The method of claim 22, wherein said plurality of programmable functional elements and said plurality of voters are organized into a plurality of blocks, and further comprising the step of:

selectively closing at least two switches for operably connecting any one of said plurality of blocks to another of said plurality of blocks.

* * * * *